United States Patent [19]

Ogawa et al.

[11] Patent Number: 4,737,973
[45] Date of Patent: Apr. 12, 1988

[54] CRYSTAL MONOCHROMATOR

[75] Inventors: Taro Ogawa, Kodaira; Shinji Kuniyoshi, Tokyo; Yoshinori Nakayama, Sayama; Takeshi Kimura, Higashimurayama, all of Japan

[73] Assignee: Hitachi, Ltd., Tokyo, Japan

[21] Appl. No.: 941,647

[22] Filed: Dec. 15, 1986

[30] Foreign Application Priority Data

Dec. 18, 1985 [JP] Japan .................. 60-282849

[51] Int. Cl.$^4$ .......................... G21K 1/06; G01T 1/36
[52] U.S. Cl. ........................ 378/84; 378/85; 378/82
[58] Field of Search ............... 378/84, 85, 82

[56] References Cited

U.S. PATENT DOCUMENTS 4,261,771  4/1981  Dingle et al. .................. 378/84

FOREIGN PATENT DOCUMENTS 0049231  3/1985  Japan ........................ 378/84

OTHER PUBLICATIONS

Underwood and Barbee, "Layered Synthetic Microstructures as Bragg Diffractors for X-rays and Extreme Ultraviolet: Theory and Predicted Performance," 9/81, Applied Optics, 20(17)pp. 3027–3034.

Primary Examiner—Carolyn E. Fields
Assistant Examiner—Joseph A. Hynds
Attorney, Agent, or Firm—Antonelli, Terry & Wands

[57] ABSTRACT

A focusing X-ray crystal monochromator in which one or more crystal layers having different spacings of lattice plane are stacked on a crystal base. Due to different spacings of lattice plane, the angle of reflection and diffraction of a diverging incident X-ray beam can be so changed that the beam takes a parallel or focusing direction for monochromatization. Thus, the monochromator of the present invention can be applied to the X-ray lithography for transferring a pattern of high resolution or the X-ray analysis such as the fine X-ray diffraction.

6 Claims, 4 Drawing Sheets

CRYSTAL MONOCHROMATOR

BACKGROUND OF THE INVENTION

The present invention relates to an applied technical field of X-rays having a wavelength of about 10 Å or less and, more particularly, to a crystal monochromator suitable for an X-ray lithography, an X-ray analysis and an X-ray analyzer, in which an X-ray beam is monochromatized and focused to irradiate a specimen with a high intensity.

In the prior art, in case an X-ray beam having a wavelength of about 10 Å is to be monochromatized and focused to have its intensity increased so that it may be used for the X-ray analysis or the like, a crystal monochromator made of a single-crystal material such as Si or Ge has to be bent (with a radius of curvature R of several tens cm to several cm) to focus its diffracted X-ray beam, as is disclosed in "Interpretation of Some Experimental Data Concerning Bent Monochromators for Synchrotron X-ray Radiation" by A. Boeuf et al., J. Appl. Crystal, pp. 265 to 267, Vol. 11, 1978. In order to bend the crystal material such as Si or Ge, however, it is usually necessary to slice the crystal to a thickness of several mm or less and to apply a stress 3 from the two ends, as shown in FIG. 1. This necessity makes it defectively difficult to hold a constant curvature at each portion of the crystal having lattice planes 2.

SUMMARY OF THE INVENTION

An object of the present invention is to eliminate the above-specified defect of the crystal monochromator according to the prior art and to provide a novel crystal monochromator which has a function to focus only a specific wavelength of an X-ray beam composed of a number of X-rays of different wavelengths without bending the crystal by the stress applying method or the like.

In order to achieve the above-specified object, the crystal monochromator of the present invention uses a crystal assembly in which a number of crystal layers having different spacings of lattice plane are placed on a base crystal material. Here, the crystal layers partially may have the same spacing of lattice plane as that of the base crystal. In the case of a single crystal layer, on the other hand, the spacing of lattice plane of this crystal layer has to be different from that of the base crystal.

The focusing action of the crystal monochromator of the present invention will be cursorily reviewed in the following with reference to FIG. 2.

The present crystal monochromator 4 is constructed of a base 5 and a number of crystal layers 6 having different spacings of lattice plane. As a result, X-rays are so diffracted at the individual layers as to satisfy the Bragg condition so that the incident X-rays ranging from 10 (incident angle 12) to 11 (incident angle 13) are diffracted and focused into diffracted X-rays ranging from 16 to 17 (diffraction angle 14).

In the case of the crystal monochromator using a single crystal according to the prior art, on the contrary, nothing but the single X-rays satisfying the Bragg condition is diffracted. Therefore, the intensity of the X-rays diffracted and focused by the crystal monochromator according to the present invention in which plural x-rays are diffracted is several to several tens times higher than the one according to the prior art.

According to the present invention, moreover, the spacing of lattice plane of the crystal can be changed by adjusting the composition of the crystal and the concentration of a dopant.

The present invention naturally accepts that the order of stacking the crystal layers may be different from that of the magnitudes of the spacings of lattice plane.

The present invention can be practised if the ratio $\Delta d/d$ of the displacement ($\Delta d$) of the spacing of crystal plane in the present monochromator to the spacing d of crystal plane of a reference crystal layer (including the base) is within a range of $4 \times 10^{-5}$ to $1 \times 10^{-3}$ which is equivalent to a range of $4 \times 10^{-3}\%$ to $1 \times 10^{-1}\%$. The monochromatic function is not proper for the range less than $4 \times 10^{-5}$, and the crystal becomes unstable for the range more than $1 \times 10^{-3}$.

On the other hand, the total thickness of the crystal is limited to $5t_h$ (wherein $t_h = (mc^2/e^2) \cdot Vc/2 2d_h \cdot 1/|FH|$), at which the absorption of X-rays jumps. In the equation of $t_h$:

m: Mass of electron;
c: Velocity of light;
e: Elementary charge;
Vc: Volume of unit cell;
$d_h$: Spacing of lattice plane; and
Fh: Structure factor.

According to the present invention, it is possible to provide a crystal monochromator which has a function to monochromatize and focus a diverging X-ray beam without bending the crystal by a method for stress application or the like.

The crystal monochromator of the present invention is excellent in industrial effects because it can be applied to an X-ray lithography for transferring a fine pattern, an impurity analysis of a minute area, or an X-ray diffraction.

DETAILED DESCRIPTION OF THE PRESENTLY PREFERRED EMBODIMENTS

Example 1

In this example, a crystal monochromator manufactured for focusing characteristic X-rays emitted from an X-ray tube will be described together with an X-ray lithography using the crystal monochromator and an apparatus therefor.

Figure 1:
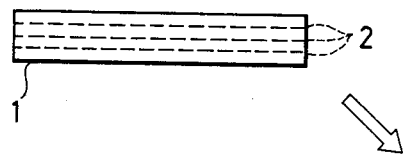
FIG. 1 is a schematic view showing an example of the prior art, in which the crystal is stressed and bent.
Figure 2B:
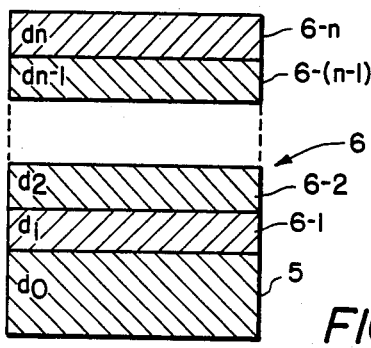
FIG. 2A is a schematic side elevation showing the concept of the focusing function of the crystal monochromator of the present invention and FIG. 2B is a schematic illustration of the lattice planes.
Figure 2A:
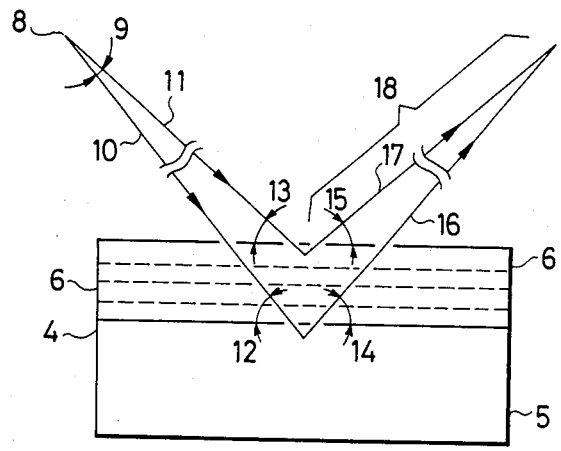
Figure 3:
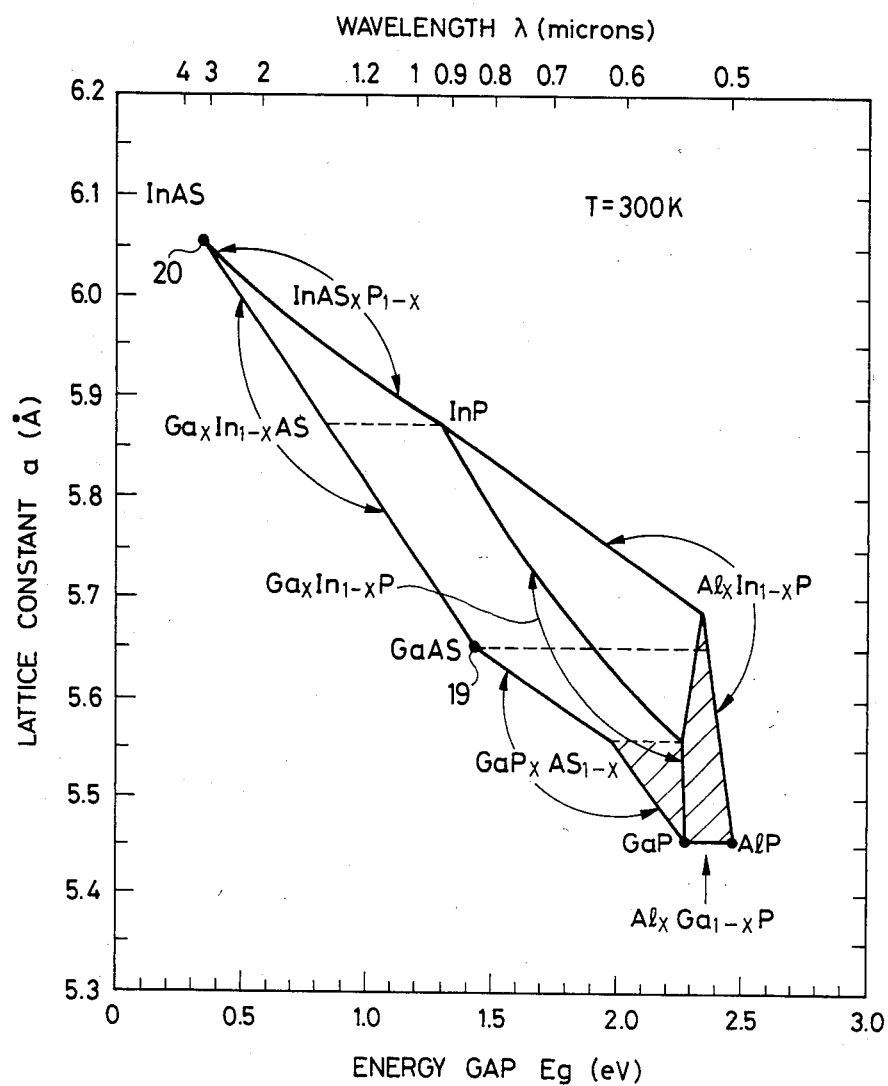
FIG. 3 is a phase diagram of GaAs and an impurity.

In this example, the crystal monochromator has been manufactured by stacking twenty-five layers 6 (6-1, 6-2, ... 6-n) of $Ga_xIn_{1-x}As$, which has a constant spacing of crystal lattice plane of about 400 Å and the upper ones of which always have a larger spacing d of lattice plane than that of the lower ones by $\Delta d/d = 4 \times 10^{-5}$ (wherein $\Delta d$: the displacement of the spacing of lattice plane), on a base crystal of GaAs, which has its surface located on a (111) plane and a spacing of crystal lattice plane of 3.26 Å, by the molecular beam epitaxy (which will be abbreviated to the "MBE process") or the metal organic chemical vapor deposition (which will also be abbreviated to the "MOCVD process"). Thus, as shown in FIG. 2B with d representig the spacing of the lattice plane of the base crystal layer 5 and $d_1, d_2, \ldots d_n$ representing the spacing of the lattice plane of the stacked crystal layers 6-1, 6-2, ... 6-n, respectively, the spacing of the lattice plane of an upper crystal layer is greater than that of a lower crystal layer in accordance with the relationship $d_0 < d_1, < d_2, \ldots < d_{n-1} < d_n$. The $Ga_xIn_{1-x}As$ can have its crystal lattice constant gradually changed by changing the composition of In little by little, as is disclosed in "Heterostructure Lasers" by H. C. Casey, Jr. et al., Academic Press, Inc. FIG. 3 presents the phase diagram of $Ga_xIn_{1-x}As$. The GaAs crystal has a spacing of lattice plane of about 5.65 Å on its (100) plane whereas the InAs crystal has a spacing of lattice plane of about 6.06 Å on its (100) plane, as seen from FIG. 3. It is accordingly found from FIG. 3 that the spacing of crystal lattice plane of GaAs increases about 7.1% if the composition of $Ga_xIn1_{-x}$. As changes from 19 to 20.

As has been described hereinbefore, therefore, the change in the ratio $\Delta d/d$ of about $4 \times 10^{-5}$ between the adjoining layers can be effected by changing the In composition by about 0.06%.

Figure 4:
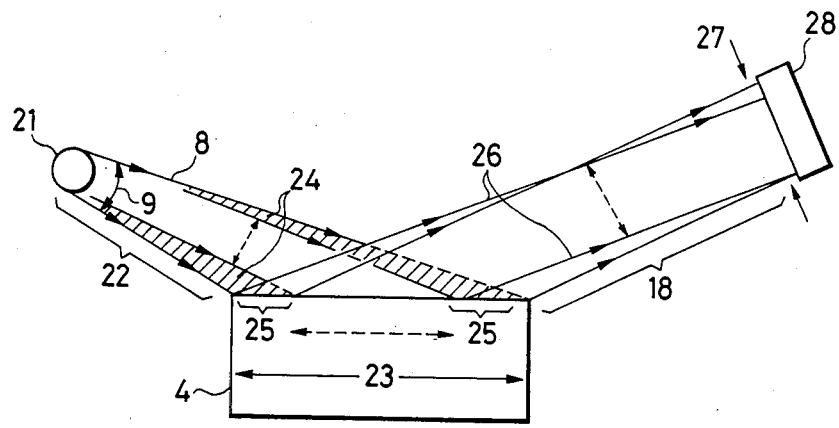
FIG. 4 is a schematic diagram showing an example for focusing characteristic X-rays emitted from an X-ray tube by using the crystal monochromator of the present invention.

FIG. 4 shows an example in which the characteristic X-rays such as $MoK\alpha_1$ rays emitted from a X-ray tube (not shown in the drawing) are focused by the crystal monochromator of the present example. An X-ray beam 8 emitted from a beam source 21 of about 1 mm width placed on a Mo target in the X-ray tube was applied to the crystal monochromator having a crystal surface width 23 of 10 mm for emitting a diffracted X-ray beam. In this example, the spacing 22 between the beam source 21 and the crystal monochromator 4 was set at about 100 mm. Moreover, this setting was supplemented by containing an angle of about 6.24 degrees between the optical axis of the X-ray beam 8 and the surface of the crystal monochromator 4. As a result, for the $MoK\alpha_1$ rays having a wavelength $\lambda$ of about 0.709 Å, diffracted X-rays 26 satisfying the Bragg diffraction condition and having the wavelength $\lambda$ equal to that of the wavelength of $MoK\alpha_1$rays were emitted.

In the present crystal monochromator, such a component 24 of the divergence 9 of the incident X-ray beam as had an angle of divergence of about $10^{-4}$ rad., i.e. as had a divergence of about 90 μm calculated in terms of the width 25 on the surface of the crystal surface was diffracted and focused on a point which was spaced by about 100 mm, as at 18, from the crystal monochromator 4. The angle between the optical axis of the diffracted X-rays 26 and the crystal surface was equal to the one between the optical axis of the incident X-ray beam 8 and the crystal monochromator 4 according to the Bragg diffraction condition. In this example, moreover, the beam source 21 had a width of about 1 mm so that the incident X-ray component 24 having the angle of divergence of $10^{-4}$ rad. was applied to all over the area of the width 23 of the crystal monochromator 4. As a result, the diffracted X-ray beam 26 was reflected from the width 25 having a divergence of 90 μm in an arbitrary position on the width 23 of the surface of the crystal monochromator 4 and was focused in a portion having a width 27 of 1 mm or less taken in its advancing direction until it reached the spacing 18. As a result, by placing a specimen 28 in a position of the spacing 18, the portion of the specimen 28 having a width of about 1 mm could be irradiated with a $MoK\alpha_1$ monochromatic X-rays of several to several tens times stronger integrated intensity than that of the existing crystal monochromator.

This example is accompanied by a problem that the intensity of the diffracted X-ray beam emitted from the lower crystal layers is decreased. However, this problem can be solved by making the lower crystal layers thicker than the higher layers to intensify the X-ray beam diffracted from the lower layers.

On the other hand, the manufacture of the present crystal monochromator can be realized with similar effects not only by the method exemplified in the present example but also by a method of implanting an impurity in a changing concentration into the crystal of Si or the like to gradually change the spacings of crystal lattice plane or by a method of epitaxially growing layers of different impurity concentrations on the base crystal of Si or the like to stack layers of different spacings of crystal lattice plane.

Moreover, the present crystal monochromator has a one-dimensional focusing effect for a diverging X-ray beam but is enabled to acquire a focusing effect for a two-dimensional divergence of X-rays by curving it with a radius of curvature R of several tens cm to several m.

On the other hand, this example could be similarly practised by using Ge, emerald, quartz, garnet and InSb as its base crystal material.

Example 2

Figure 5:
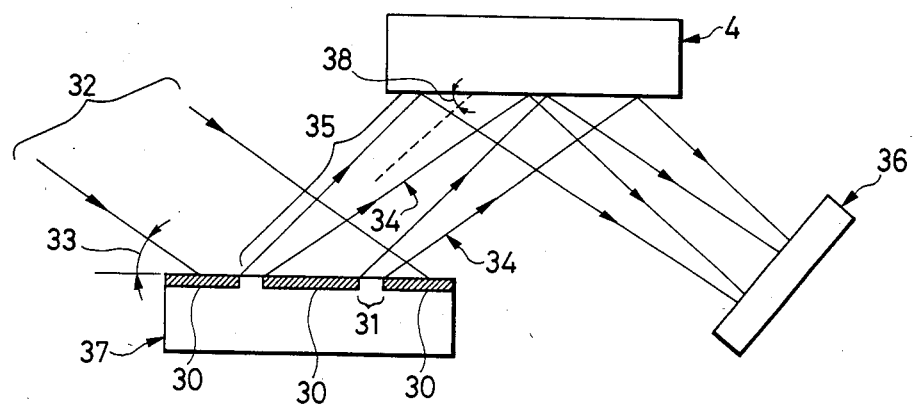
FIGS. 5 and 6 are schematic diagrams showing the concept of an X-ray lithographic system using the crystal monochromator according to the present invention.

The X-ray lithography using the crystal monochromator of the present invention will be described with reference to FIGS. 5 and 6.

The pattern to be transferred by the X-ray lithography was an Au pattern 30 formed on the surface of a crystal 37. This crystal 37 was a Si crystal having a spacing of crystal lattice plane of about 3.14 U and a surface located on the (111) plane, and its Au pattern 30 was formed by the vacuum deposition. This Au pattern had a spacing of 2 μm.

An incident X-ray beam 32 emitted from the (not shown in the drawing) X-ray beam source generated a diffracted X-ray pattern at the portion 31 having no Au pattern. The X-rays 33 applied to the Au pattern 30 were not diffracted.

The focusing crystal monochromator 4 of this example was manufactured by stacking thirty $Ga_xIn_{1-x}As$ layers, each having its In composition reducing by about 0.025% for each 600 Å, on a crystal base of GaAs which had a spacing of crystal lattice plane of about 3.26 Å and a surface located on the (111) plane, by a method similar to that of the example 1. The change in this In composition brought a change of $\Delta d/d = 1/.7 \times 10^{-5}$ in the spacing of lattice plane.

In case both the spacing between the pattern crystal 37 and the focusing crystal monochromator 4 and the spacing between the crystal monochromator 4 and a wafer 36 were set at 50 mm whereas the angle of incidence of X-rays into the crsytal monochromator 4 was set at 28.8 degrees, the aforementioned pattern of 2 μm was projected as a pattern of about 1 μm on the wafer 36.

Figure 6:
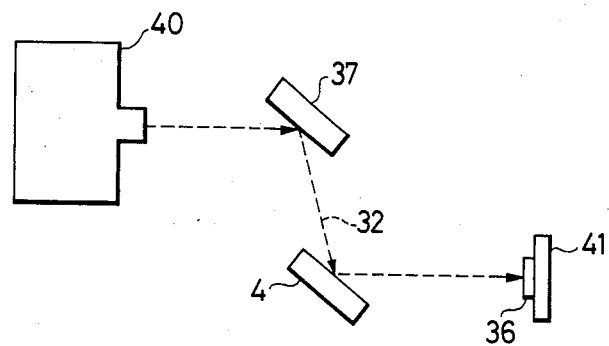

Turning to FIG. 6 presenting the concept of an X-ray lithographic system using the crystal monochromator described above, the X-ray beam 32 emitted from its source 40 was diffracted and focused by the pattern-bearing crystal 37 and the focusing crystal monochromator 4 and was projected on the surface of the wafer 36 having a resist. This wafer 36 was supported by a jig 41. Incidentally, the X-ray beam source 40 used was a known X-ray tube or synchrotron radiation source.

Example 3

In this example, the crystal monochromator was manufactured by stacking twenty five crystal layers, which had a constant spacing of crystal lattice plane d at every 450 Å of the layer thickness and in which the spacing of lattice plane of the upper layers was always larger by about $\Delta d/d = 4 \times 10^{-5}$ than that of the lower layers, by the CVD (i.e. chemical vapor deposition) method, on a Si base, which had a surface located on the (111) plane and a spacing of crystal lattice plane of 3.13 Å.

In order to change the spacings of lattice plane of the individual crystal layers in this example, the dosage of an impurity was uniform in each layer but changed in the adjacent layers. If phosphor P was adopted as the impurity to dope the Si base in a concentration of $10^{21}$ atoms/cm$^3$ the crystal had a lattice strain of about $10^{-5}$. In order to change the ratio $\Delta d/d$ between the adjoining layers by about $\Delta d/d = 4 \times 10^{-5}$, it was sufficient to increase the P concentration in the upper layers by $4 \times 10^{19}$ atoms/cm$^3$.

Reverting to FIG. 4, the monochromator 4 was set such that the spacing 22 between the beam source 21 having a width 1 mm for a MoKα$_1$ X-ray beam 8 having a wavelength λ of about 0.709 Å and the surface of the crystal monochromator 4 having the width 23 of 10 mm was about 100 mm and that the angle between the optical axis of the X-ray beam 8 and the surface of the crystal monochromator 4 was 6.49 degrees.

As a result, the component 24 having an angle of divergence of about $10^{-4}$ rad of the divergence 9 of the incident X-ray beam 8, i.e., the incident X-ray component 24 having a divergence of about 100 μm calculated in terms of the width 25 on the crystal surface could be diffracted and focused at a point of the spacing 18 of about 100 mm from the crystal monochromator 4.

Since, moreover, the beam source 21 had the width of 1 mm in this embodiment, the diffracted X-rays 26 could be generated from all the area of the width of the crystal monochromator 4 to irradiate the area, which had the width of 1 mm of the specimen 28 placed at the spacing 18, with the MoKα$_1$ monochromatic X-rays of several to several tens times stronger integrated intensity than that of the ordinary crystal monochromator.

Incidentally, although the present example used P as the impurity, similar results were obtained even if B, Al, Ga, P, As and Sb were used.

Example 4

An X-ray diffraction of a minute area using the crystal monochromator described in the example 3 will be described in the following.

Figure 7:
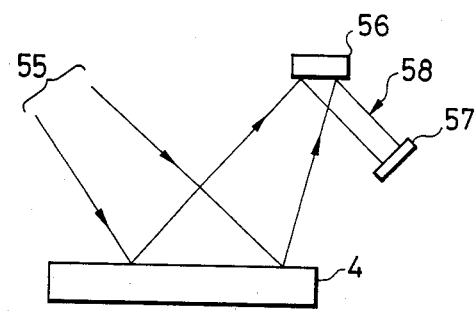
FIG. 7 is a schematic diagram showing the concept of an X-ray diffraction of a minute area by using the crystal monochromator according to the present invention.

Turning to FIG. 7, an X-ray beam 55 was focused and monochromatized by the focusing crystal monochromator 4 used in the example 3. The surface of a specimen 56 was irradiated with the X-ray beam 55 having a diameter of 0.5 μm. The resultant diffracted image 58 was photographed on a silver salt film 57. By this method, a diffracted X-ray image of the minute area of the crystal could be obtained to clarify the crystal structure.

Example 5

The example to be described is directed to the analysis of a minute area of a specimen surface by the X-ray photoemission spectroscopy using the focusing crystal monochromator according to the present invention.

Figure 8:
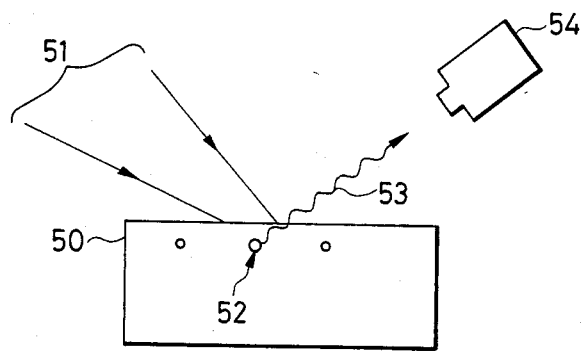
FIG. 8 is a schematic diagram showing the concept of an X-ray photoemission spectroscopy by using the crystal monochromator according to the present invention.

Turning to FIG. 8, the surface of a specimen (e.g., a Si crystal containing Ge or Ga as an impurity 52) 50 was irradiated with an X-ray beam (which had a diameter of 0.5 μm on the specimen surface) 51, which was focused and monochromatized by the (not shown in the drawing) focusing crystal monochromator. The photoelectrons 53 from the impurity 52 were detected by a detector 54 to measure the concentration of the impurity in the minute area.

Throughout the examples of the present invention, the base crystal material could be similarly practised even using Ge, emerald, quartz, garnet and InSb, and the individual crsytal layers could be practised within a thickness range of 30 to 2,000 Å and within a layer number of 1 to 500.

What is claimed is:

1. A crystal monochromator for monochromating X-rays comprising a base crystal layer and a plurality of crystal layers stacked on said base crystal layer, an upper crystal layer of said plurality of stacked crystal layers having a larger spacing of lattice plane than that of each lower crystal layer of said plurality of stacked crystal layers.

2. A crystal monochromator according to claim 1, wherein each upper crystal layer of said plurality of stacked crystal layers has a larger spacing of lattice plane than that of the adjacent lower crystal layer of said plurality of stacked crystal layers.

3. A crystal monochromator according to claim 2, wherein said upper crystal layer has a larger spacing of lattice plane than that of said adjacent lower crystal layer by $4 \times 10^{-3}$% to $1 \times 10^{-1}$%.

4. A crystal monochromator according to claim 1, wherein materials of said base crystal layer and said plurality of stacked crystal layers are a crystal of GaX-In$_{1-x}$P$_y$As$_{1-y}$.

5. A crystal monochromator according to claim 1, wherein a material of said base crystal layer is selected from a group conssiting of Si, Ge, emerald, quartz, garnet and InSb.

6. A crystal monochromator according to claim 1, wherein each of said crystal layers of said plurality of stacked crystal layers has a larger spacing of lattice plane than that of said base crystal layer.

* * * * *